United States Patent [19]

Goldberg

[11] Patent Number: 5,416,569
[45] Date of Patent: May 16, 1995

[54] ELECTROGRAPHICALLY MAKING DEVICES HAVING ELECTRICALLY CONDUCTIVE PATHS CORRESPONDING TO THOSE GRAPHICALLY REPRESENTED ON A MASK

[76] Inventor: Michael Goldberg, 62 Meek's Point Rd., East Hampton, Conn. 06424

[21] Appl. No.: 637,469

[22] Filed: Jan. 4, 1991

[51] Int. Cl.⁶ ............................................. G03G 15/14
[52] U.S. Cl. .................................... 355/277; 355/311; 430/126
[58] Field of Search ............... 355/271, 311, 274, 277, 355/208, 256–258; 346/135.1, 159; 430/126, 31, 49

[56] References Cited

U.S. PATENT DOCUMENTS

| | | | |
|---|---|---|---|
| 3,890,621 | 6/1975 | Cantarano | 346/135.1 |
| 4,548,885 | 10/1985 | Brechlin | 430/49 |
| 4,859,557 | 8/1989 | Detig et al. | 430/100 |
| 4,879,184 | 11/1989 | Bujese et al. | 430/126 |
| 4,897,326 | 1/1990 | Marengo | 430/31 |
| 4,956,670 | 9/1990 | Masuda et al. | 355/210 |
| 4,967,227 | 10/1990 | Suzuki et al. | 355/32 |
| 4,968,570 | 11/1990 | Bujese | 430/49 |
| 4,969,012 | 11/1990 | Suzuki et al. | 355/212 |
| 4,970,130 | 11/1990 | Tam et al. | 355/211 X |
| 5,049,942 | 9/1991 | Bujese | 355/272 |
| 5,294,290 | 3/1994 | Reeb | 156/630 |

Primary Examiner—Leo P. Picard
Assistant Examiner—Christopher Horgan
Attorney, Agent, or Firm—Fish & Richardson

[57] ABSTRACT

Devices having conductive paths are fabricated by electrographically transferring conductive toner to an insulative copy sheet imaging desired conductive paths graphically represented by an electromagnetic signal. A system for making devices having electrically conductive paths corresponding to those graphically represented on a mask has an electrographic machine having electrically conductive toner and a bonder for bonding the electrically conductive toner to a copy sheet. An insulative copy sheet is configured to pass through the electrographic machine bonder and receive the electrically conductive toner only on paths corresponding to those graphically represented on the mask. The electrically conductive toner has a conductivity sufficiently high so as to provide electrically conductive paths along a copy sheet bearing an electrographically transferred image of the mask with the electrically conductive toner bonded to the copy sheet along the electrically conductive paths with the resistance between points along the conductive paths being many times less than that of regions adjacent to the electrically conductive paths.

19 Claims, 5 Drawing Sheets

ELECTROGRAPHICALLY MAKING DEVICES HAVING ELECTRICALLY CONDUCTIVE PATHS CORRESPONDING TO THOSE GRAPHICALLY REPRESENTED ON A MASK

The present invention relates in general to fabrication of devices with conductive paths and more particularly concerns electrographically making devices with conductive paths, such as printed circuits.

It is known to fabricate printed circuit boards by preparing a mask of the desired arrangement of conductors (referred to in the industry as a phototool), exposing a photosensitive resist on the printed circuit board with an image of the mask, and developing and etching the exposed area to provide the desired conducting pattern. An alternate approach also involves developing and etching a thinner conductive foil, and electroplating the etched pattern to build up a thicker conductive pattern with sharp edges and vertical skirts.

Electrostatic copiers produce a copy of a document by selectively depositing a black (or colored) powder, referred to as toner, onto plain paper sheets. This process centers around a photoconductive drum or belt, hereafter referred to as the image receptor. It is typically accomplished in several steps.

A receptor, typically a drum or belt with a grounded metallic core or back, rotates past a charging corotron where the receptor surface receives a blanket charge of about 600 volts. The corotron is typically a very fine gold wire with a grounded shield. A high voltage (approx 6000V) of desired polarity is applied to this wire with a suitable power supply. The wire then rains ions onto the drum surface with sufficient velocity to charge the surface of the receptor. This charge remains intact on the receptor surface because it is an insulator in the dark.

The receptor surface is then exposed to a projection of the original to be copied, by means of suitable illumination and optics. Most machines project only a small horizontal strip of the original. The entire height is vertically scanned by a moving platen or moving mirror assembly. This motion is synchronous with the receptor rotation, and the image is effectively wrapped around the receptor.

Wherever light strikes the receptor, it conducts, and the receptor surface charge bleeds to ground. This charge bleeding only occurs in the surface portions imaging white background areas of the original. The receptor areas imaging dark areas on the original do not receive light, and the charge there is not affected. This exposure leaves an invisible latent charge pattern image of the original on the drum.

The latent image on the receptor is developed by dispensing a fine pigmented powder, referred to as toner, onto the receptor. The toner is electrostatically attracted only to the charged areas on the receptor, effectively developing the latent image.

Toner particles are typically primarily polystyrene or similar plastic resin, about 10 microns in diameter, with a small amount of carbon black impregnated for pigmenting. To facilitate this attraction to the receptor, the toner must have an overall charge of polarity opposite to the receptor image charge. Toner charging is typically accomplished by triboelectric means. The developer assembly agitates the toner with screw augers or the like to create friction between the toner and a triboelectric partner. This partner is often another powder called a carrier. This carrier may comprise ferrous particles about 100 microns in diameter, coated with a plastic that exhibits the correct triboelectric behavior for the respective toner. If a carrier is not used, the partner may be a plastic surface in the developer assembly.

A magnetic brush assembly, comprising a nonmagnetic sleeve generally of aluminum or stainless steel, with a multipole cylindrical magnet inside it, typically dispenses the toner to the receptor from a container. A doctor blade mounted parallel to the sleeve, about 300 microns from the sleeve surface, maintains a constant toner thickness on the sleeve.

In a magnetic brush machine, either the carrier powder (dual component toner) or the toner itself (monocomponent toner) is magnetically permeable. Monocomponent toners are impregnated with a ferrite compound to facilitate this. Under the influence of the multipole magnet, the toner particles stand up in short chains on the surface of the sleeve and form bristles of a brush.

The sleeve or magnet is typically rotated at about 300 RPM, and the brush rotates with it. The sleeve is positioned so the brush just contacts the receptor surface in the nip area, between the sleeve and the receptor. The image charge attracts the toner from the brush to the receptor. Counterforce is provided by the magnet itself in monocomponent machines. In dual component machines, the toner particles are not magnetic, but are electrostatically attached to the carrier particles, which are magnetic.

The developed image is moved from the receptor to a clean sheet of paper by passing the paper, in synchronous contact with the receptor, past a transfer corotron. This corotron applies a high charge, of the same polarity as the receptor image, to the back side of the paper. This charge attracts the toner strongly enough to strip the developed image off the receptor surface onto the paper.

The paper typically passes through a fuser stage comprising two rollers that usually have a silicone rubber covering, although both polished and etched metal rollers have been used. One or both rollers typically has a heating element inside, which melts the toner powder. The toner then briefly becomes an isotropic liquid and permeates the fibers of the paper. The toner cools rapidly, leaving a durable plastic image that is integral with the paper fibers.

Triboelectric toner charging accommodates insulative properties of plastic toner but is not practical for bulk charging conductive powders because of the poor triboelectric properties and density of metal.

Triboelectric charging occurs on the surface of a particle. As a result, a particle of density X develops 10 times the charge per unit mass of a particle of density 10X. Metal particles are not likely to attain a charge more than ⅛ the charge of a typical plastic toner particle.

The force for accelerating a toner particle from the developer sleeve to the receptor surface is directly related to the particle mass. Metal particles typically need about eight times the accelerating force required for typical plastic toner particles. The accelerating force is directly proportional to charge per unit mass, thus metallic toners typically require about eight times the charge density of plastic toners yet the charge density for metal particles is typically an order of magnitude less than that of plastic toner particles.

One approach for charging conductive toners is the induction charging method that relies on the current path from the receptor surface to ground through the toner chains of the magnetic brush. The current flow through the toner charges the toner particle closest to the drum. Induction machines typically use a plastic toner with sufficient carbon impregnation to provide comparatively low resistance with respect to insulating toners. This resistance is still much higher than that of metals. This method is undesirable for printed circuit fabrication because it typically produces a monolayer image.

According to the invention, devices having conductive paths, such as printed circuits, are fabricated using an electrographic process with electrically conductive toner fused to an insulative sheet having an electrographically transferred image of the mask pattern.

Other features and advantages will become apparent from the following detailed description when read in connection with the accompanying drawings, in which:

Figure 1:
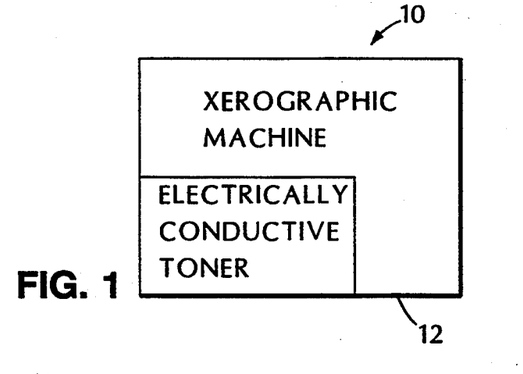
FIG. 1 is a diagrammatic representation of a system for making printed circuits in accordance with the present invention.

With reference to the drawing and more particularly FIG. 1, system 10 for making printed circuit boards includes electrographic machine 12, described below. Machine 12 includes conductive toner of particulate material with conductivity sufficiently high so that when electrographically transferred to the insulative copy sheets along desired electrically conductive image paths corresponding to object paths graphically on a represented mask, the resistance between any points along these paths is less than accepted standards for printed circuit board conductive path resistance, and a bonding system for fusing conductive toner into foil and bonding it to an insulative copy sheet. The insulative copy sheet may be mylar, polyamide (tradename, Kapton), fiberglass epoxy (industry designated as G10 or FR4), or other suitable insulating substrate material.

The preferred toner is copper powder. A ferrous oxide or other magnetically susceptible carrier material may be blended with the toner for magnetic brush development techniques. A suitable toner may also include a combination of solder powder and copper. Flux may be applied immediately after imaging by spray flow or mist techniques. Microencapsulated flux may be blended with the toner.

In operation, a mask for a printed circuit board is placed on the exposure glass of electrographic machine 12. This mask may be a drawing of the conducting pattern. Machine 12 is then operated, causing the conductive toner to be electrographically transferred to the insulative copy sheet in a pattern corresponding to the desired conductive path layout of the printed circuit board on the mask. The substrate may be flexible or rigid to accommodate the end user requirements. The mechanical design of machines for handling rigid materials, will differ slightly from machines for flexible materials. However, the process is the same in both cases.

It may be less expensive to produce a machine for handling flexible material. For prototyping applications, the flexible sheet may be placed against an adhesive rigid backing sheet after imaging.

The copy sheet and backing sheet may be rigid or flexible. One may be flexible and the other rigid. The backing sheet may be insulative or conducting depending on the application. A conducting backing sheet may function as a ground plane.

In the case of a laser printer or page printer application, the finished boards may be produced directly from computer data. This embodiment is especially useful when the layout is generated by computer software. In this embodiment, the conventional phototool is eliminated completely, and the machine 12 emulates a photoplotter compatible with the CAD software employed. Finished panels are produced in the same manner as with phototools.

An important benefit of a data driven configuration (i.e. non-optical) is in the transfer step. It is difficult to transfer conductive toners from the imaging drum or belt because unlike conventional plastic toners, they retain very little charge. After imaging, the toner charge may immediately bleed to the drum surface, rendering corona transfer highly ineffective. Inductive transfer or pressure transfer, avoids this difficulty. It is preferable and cost effective to eliminate transfer from drum or belt altogether.

This embodiment uses a data driven machine to directly apply the latent image charge to the substrate (copy sheet) instead of the drum or belt. The substrate may be then passed directly to the developer and fuser stages. This approach is both especially practical and economical.

In a further improvement, the various layers of a multilayer circuit board may be produced in sequential order and automatically collated, instead of the conventional approach, which creates large batches that are hand collated at great expense and delay.

The properties of metals and printed circuit board design standards preclude a simple adaptation of conventional electrography for electrographically fabricating printed circuits. Metallic toner does not materially affect latent image formation. However due to transfer considerations, the target substrate may be imaged instead of a drum or belt receptor. The substrate is not likely to be photoconductive; however, direct receptor imaging may be effected.

Delphax and KCR offer commercially available techniques to place image charge on the receptor surface, where it is desired, instead of placing a blanket charge and selectively removing it. Delphax uses a print head that projects laminar ion streams onto the image receptor, creating image dots at a resolution of 240 dots per inch. KCR uses a contacting pin comb and a receptor belt that accomplishes the same purpose by high voltage discharge.

The Delphax method may be more suitable for rigid substrates. In addition, the Canon NP process may be modified for directly imaging a web, as described below.

Figure 2:
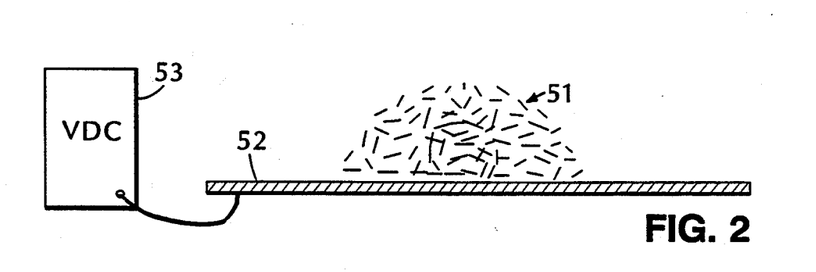
FIGS. 2 and 2A are a pictorial representation illustrating a charging technique according to the invention.

Referring to FIG. 2, there is shown a pictorial representation helpful in understanding a charging technique which advantageously uses the conductivity of metal toner powder. If a quantity of metal toner powder 51 is placed on a metal plate 52 to any desired depth, and plate 52 receives a voltage V from power supply 53, conducting metal powder 51 also assumes the same voltage V on plate 52. If mechanical means then remove metal powder 51 from conducting plate 52, metal powder 51 will retain its charge with respect to ground.

Figure 2A:
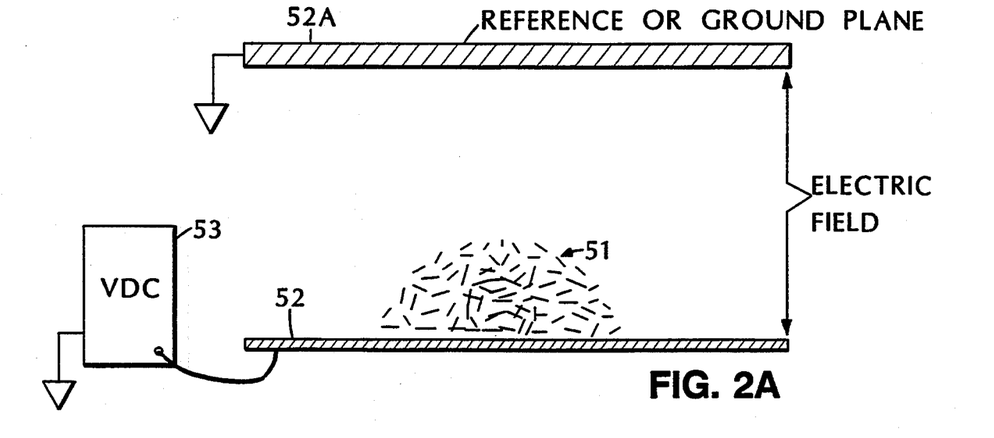

Referring to FIG. 2A, there is shown a modification of the apparatus of FIG. 2 which advantageously locates the powder in an electric field between two opposing electrodes, or planes. The primary, or contacting electrode can be metal plate 52, or the dispenser roller itself. The reference (ground) electrode 52A, which is preferably always included, may be the doctor blade, a metal strip placed near the dispenser roller for this purpose, or the receptor itself. The charging voltage of significance is the potential difference between the two effective electrodes, such as metal plate 52 and reference electrode 52A. The copper powder assumes the voltage of the contacting plane, such as metal plate 52. If the mass of metal powder 51 on plate 52 is varied, the charge per unit mass remains unchanged, provided power supply 53 has sufficient current capacity. In practice, this current is typically 10 to 30 microamperes for a typical image.

This method according to the invention provides effectively unlimited supply of charge (contrasted with triboelectric methods that generate very limited charge magnitudes), and allows precise control of polarity and magnitude while facilitating real time electronic closed-loop feedback control that is especially useful in image density control and regulation.

A preferred method for plastic toner dispensing is the magnetic brush method described above. One approach to adapting this process for conductive toners is to use a magnetic toner powder, such as nickel or silver-plated nickel powder.

Magnetic brush systems in which the brush contacts the receptor produce monolayer images because charges in any conductor migrate to the surface closest to the opposite field charge. In a toner chain of conductive particles, all the charge migrates toward the latent image and collects in the particle nearest the receptor. The other particles remain uncharged and will not image the receptor.

A preferred way to eliminate this monolayer characteristic is to break the conduction path between the developer and the drum. This conduction path break may be accomplished with a powder cloud, jumping toner and liquid electrophoretic development.

Powder cloud involves exposing the receptor to an airborne concentration of charged toner which migrates to the latent image. The commercially available Canon NP5000 copying machine uses a magnetic brush, that generates a powder cloud in captivity in the nip area between the drum and the developer sleeve.

An embodiment of the invention employed this machine with nickel powder using the electronic charging method described above. The developer assembly was electrically isolated from ground, and attached to a voltage source. The machine was filled with 3 micron nickel powder. A direct, nearly linear response was observed between the developer voltage and the image density between 0 and 300 volts. Above 300 volts, backgrounding began to occur along with proportional response to supply voltage.

The toner assumes the same voltage potential as the developer sleeve. Just before the moment of contact with the drum, the toner is suddenly made airborne, eliminating the conductive path between the drum and the developer, allowing production of nonmonolayer images with metallic conductive toners.

In jumping toner development, the magnetic brush assembly is located such that the outermost surface of the brush does not contact the receptor, and there is a small gap of about 300 microns in the nip area. The toner is charged negatively with conventional triboelectric means. The entire development assembly is electrically isolated and biased to about 800 volts AC at about 800 Hz. This bias causes the toner to fly across the nip gap easily and coat the receptor evenly at the nip, regardless of image charge, during each negative half cycle. On each positive half cycle, the toner jumps back to the brush. However, the imaged areas retain the toner, and only toner in the background areas can escape. The polarity of the toner and image charge is not relevant to the jumping action; toner simply responds to the appropriate half cycle of the AC bias. This jumping toner development is commercialized in the Canon NP120.

Figure 3:
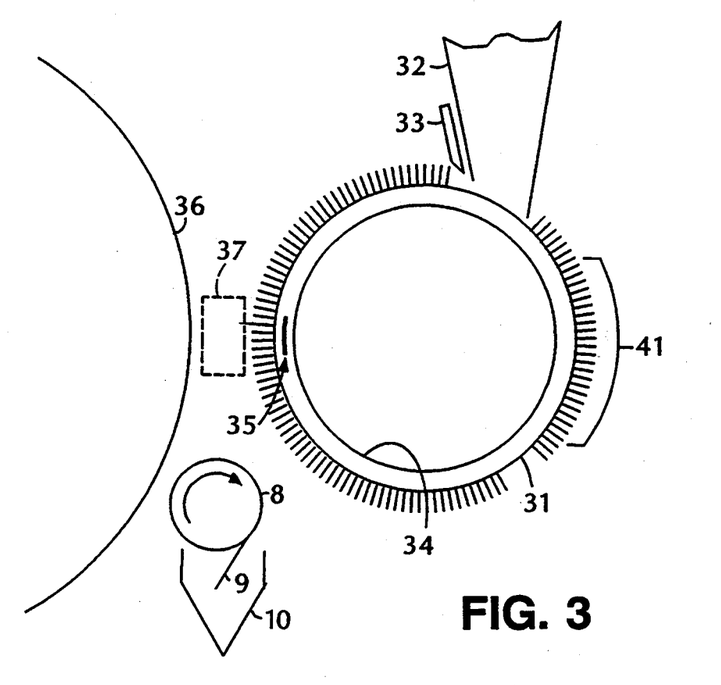
FIG. 3 is a pictorial representation of a preferred embodiment of the invention for delivering a controlled quantity of conductive toner to a receptor and recovering toner not imaged.

Referring to FIG. 3, there is shown a pictorial representation of a preferred embodiment of the invention for delivering a controlled quantity of conductive toner to the receptor and recovering what toner is not imaged. A rotatable nonconductive cylinder 31, toner container 32, doctor blade 33, nonrotating conductive inner cylinder 34 and strip electrode 35 comprise this embodiment. Toner container 32 and/or doctor blade 33 are maintained at sufficient voltage to charge the metal toner to the desired level by conduction. This voltage may be adjusted to control the contrast of the developed image. Instead of a magnet at the core to retain the toner as in a magnetic brush system for retaining magnetic toner, conductive cylinder 34 is maintained at a sufficient voltage, of polarity opposite that of the toner charge, to attract the toner to the outer cylinder 31. This arrangement forms an electrostatic brush 41. Cylinder 31 is arranged to rotate at some desired speed, typically 300 RPM. As cylinder 31 rotates, toner is metered from container 32 and trimmed to a constant thickness by doctor blade 33. The resulting constant thickness brush 41 is carried around cylinder 31 by its rotation, maintained in place by the attractive force of inner cylinder 34, until it reaches the nip area between strip electrode 35 and receptor 36.

Strip electrode 35 is the full length of cylinders 31 and 34 and receptor 36, and approximately 1 mm high. It is fixed in place at the nip area, under the surface of outer cylinder 31, and is insulated from conductive inner cylinder 34. An AC bias of nominal frequency 800 Hz and 800 volts peak-to-peak is applied to strip electrode 35.

When toner reaches the nip area 37 between strip electrode 35 and receptor 36, it oscillates across the gap between the two surfaces under the influence of the AC bias. On the half cycle of the same polarity as the toner charge, the toner is repelled from outer cylinder 31 toward receptor 36, and coats both image and nonimage areas. On the opposite half cycle, the toner is attracted back to the cylinder 31, but it is held captive to the imaged areas of receptor 36 and only the background areas are scavenged. This process leaves a clean developed image on receptor 36. Toner that returns to cylinder 31 is carried around to container 31 exit area, where additional toner is metered on as needed by doctor blade 33.

The AC bias at strip electrode 35 may have a DC offset as desired to control the ratio of forces on the toner. The DC bias on inner cylinder 34 may be adjusted to control backgrounding of the developed image.

If the AC bias for strip electrode 35 is applied instead to inner cylinder 34, with a small DC offset to retain the brush in place, strip electrode 35 may be eliminated.

If more precise control is desired, strip electrode 35 may be biased with pulsed DC instead of AC, and scavenger electrode 38 biased with DC opposite that of the toner charge. In this embodiment, strip electrode 35 propels toner toward receptor 36, but does not recover it. Scavenger electrode 38 recovers, allowing separate control of projection and scavenging voltages. Scavenger electrode 38 may be configured as a rotating cylinder with cleaning blade 39 arranged to remove excess toner to a collection container 40. Collection container 40 may be arranged to recycle toner back to container 32 by suitable conveyor means.

If desired, inner cylinder 34 may be replaced with a multipole electret, analogous to the multipole magnet in a magnetic brush system, eliminating the power supply. The electret may be rotating or fixed; if it rotates, cylinder 31 may be fixed.

Figure 4:
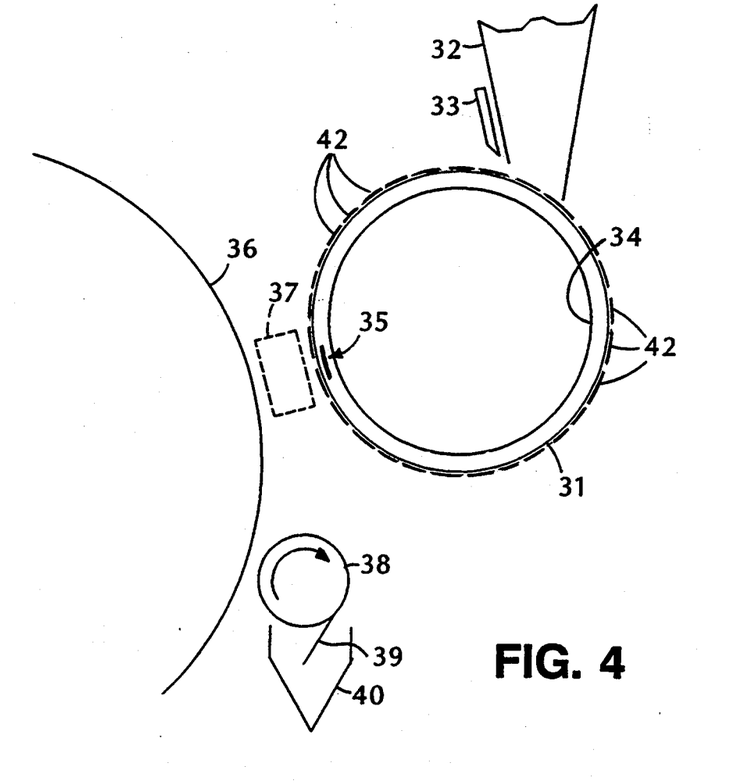
FIG. 4 shows another embodiment of the invention using a travelling field dispenser.

Referring to FIG. 4, there is shown another embodiment of the invention using a traveling field dispenser. This technique is essentially similar to the above jumping toner system, with the added advantage of no moving parts. Outer cylinder 31 does not rotate. Cylinder 31 has a plurality of parallel strip electrodes 42 evenly spaced around its surface, and covered with a thin insulating coating or wrap (not shown). The AC strip electrode 35 is located behind the gap between two parallel strip electrodes nearest nip 37. Sequentially biasing electrode 42 with alternate polarity DC voltage, causes toner to jump from one electrode to the next, as it is alternately attracted and repelled from each electrode in sequence. In this manner the brush is transported around cylinder 31 without mechanical rotation. When toner reaches the nip area, it behaves as discussed above. The voltage required to transport the toner in this way is relatively low, and is dependent on the gap width between electrodes 42. The voltage sequence is readily controlled with digital logic and high voltage drivers.

Inner cylinder 34 may be eliminated, as toner will always be attracted to the odd or even strip electrodes.

The electrostatic brush is not shown to avoid obscuring the principle of operation.

Scavenger electrode 38 may be of the traveling field type as well as cylinder 31, eliminating mechanical rotation. In this embodiment cleaning blade 39 is not needed, and strip electrodes pass only around 180 degrees of the scavenger cylinder. Toner will fall into the collection container at the last strip.

It may be advantageous to employ an aerosol dispenser which sprays the metallic toner through nozzles onto the receptor development zone. Such devices are well known in the offset printing industry. They are used for spraying talc with high precision, onto finished printwork, to prevent the sheets from sticking together.

This type of device may be configured with metallic nozzles. These nozzles may be connected to a voltage source for charging the toner by conduction as it exits. This device preferably includes a metal ring around each nozzle to provide a ground reference for the charging voltage. A conductive plate with a clearance hole at each nozzle exit, placed such that the aerosol spray passes through the holes, will also work well. Such an embodiment will provide the electric field shown in FIG. 2A. The nozzle functions as the primary or contacting electrode, while the ring functions as the reference electrode. The field between these two electrodes establishes the charge on the powder as does the field between electrodes 52 and 52A in the embodiment of FIG. 2A.

An aerosol device will provide no antibackgrounding force, or scavenging function. These functions may be provided by the scavenger system shown in FIG. 3, or by an air knife or other mechanical means.

Such mechanical means will develop force sufficient to remove the background toner from the receptor, but not sufficient to remove the image toner.

Liquid electrophoretic systems employ a very fine powder on the order of 1 micron in size, suspended in a dielectric liquid developer. The receptor surface is wetted continuously with the solution, and the particles migrate to the latent image. This method has some advantages; notably no contact with air, reducing undesired oxidation of the toner, and somewhat higher resolution due to the small particle size. The particle charge is generated by reaction with the liquid carrier and various charging agents. There are potential applications requiring very high resolution which may benefit from liquid systems. Fluorinerts and closed-loop condensing vapor recovery may be used.

As discussed above, corona transfer depends on the toner retaining its charge while attached to the receptor. Metal toners generally lose their charge; they are neutralized by the image charge. This neutralization results in essentially no relative charge, leaving the toner attached to the receptor primarily by Van der Naals forces. In this circumstance, a transfer charge on the back side of a target substrate will have little, if any, effect on the developed image.

One method for effecting imaging is to combine transfer and cold pressure fusing in a step called transfixing, currently commercialized by Delphax, discussed below.

Figure 5:
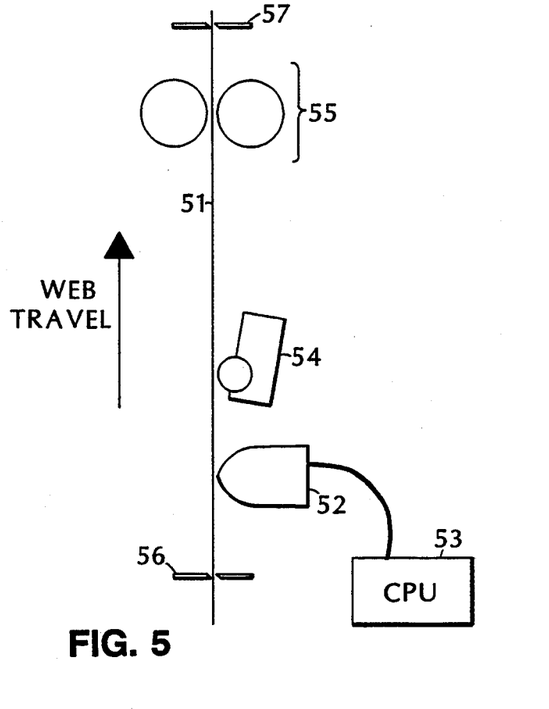
FIG. 5 is a schematic representation of a system for forming the latent image directly on the target substrate.

A second approach is to eliminate the transfer step in its entirety, by forming the latent image directly on the target substrate, e.g. Kapton film or FR4 board. This approach is schematically illustrated in FIG. 5 for flexible target media. Web 51 is the target substrate, and functions effectively as the receptor. There is no overall charging step. Web 51 passes print head 52 which applies a dot matrix image charge directly to the web 51 surface. Print head 52 is driven by raster image processor 53, which may be any suitable bitmap logic controller, well known to the page printer industry. Web 51 then passes developer unit 54, where image is developed with metallic toner as discussed above. Web 51 then passes directly to fuser unit 55, discussed below, with no transfer step required. Web 51 may be supplied as continuous web shown, or as cut sheet. Cutters 56 and 57 may be used if desired. This process is the same for both rigid and flexible media with mechanical transport and handling differences as needed. Print head 52 may be of the discharge or ion projection type for flexible media, but is preferred to be of the ion projection type for rigid media, to allow for surface runout.

The method just described is well suited for data driven applications in which artwork is not used, and the circuit layout is transmitted directly from a computer to the printed circuit fabricator. It may be desirable to use an optical approach for high resolution applications (better than 400 DPI) and in cases where existing phototools must be used.

According to another embodiment, the substrate may be imaged with a photographic receptor using the Canon NP process, modified by locating an insulating cover, typically of mylar over the entire receptor surface. The Canon NP process uses multiple coronas and a post-charging step to bring the image charge to the outside surface of the insulating cover.

Figure 6:
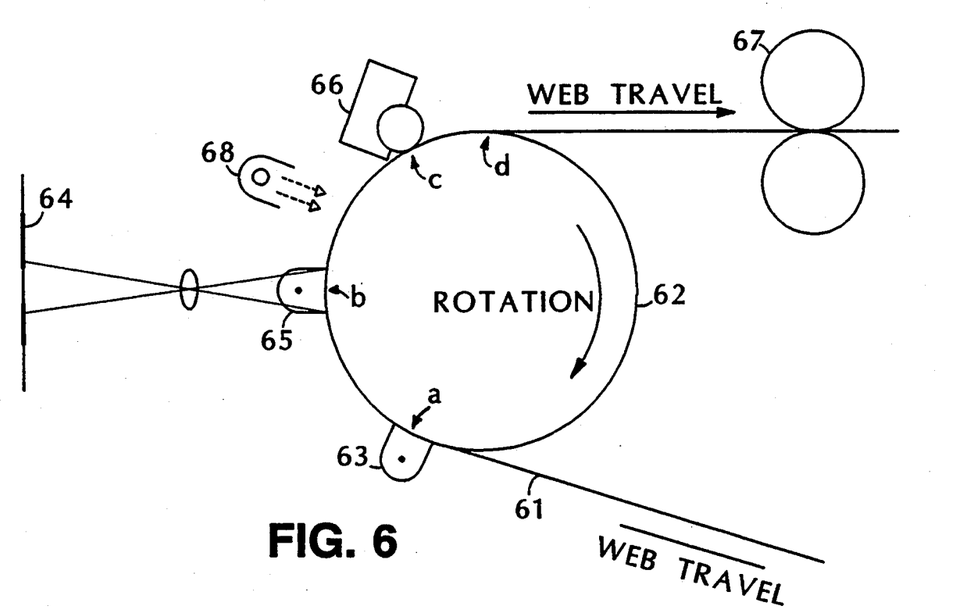
FIG. 6 is a pictorial representation of an embodiment of the invention using an insulating cover over the receptor surface.

Referring to FIG. 6, there is shown a pictorial representation of an embodiment of the invention. The target media is cover 61 wrapped around photoconductive drum 62 approximately 180 degrees, with all process steps taking place as described herein, with no transfer step. The receptor comprising drum 62 and web 61 is charged overall by DC corotron 63 exposed to the original 64 at b through AC corotron 65, uniformly exposed by lamp 68, developed at c by developer 66 and then separated from receptor drum 62 at d, and then passes to fuser 67.

This embodiment may also be used with a scanning laser or an LED array in place of the exposure optics, to facilitate an alternate, data driven configuration to the nonphotographic techniques described above.

Conventional heat type fusing is not preferred with metal toners because the temperatures for melting are relatively high. Instead a cold pressure technique with ultrasound enhancement is preferred. Cold pressure has been successfully commercialized in the copier industry. It involves passing the target substrate between two highly polished steel rollers that are pressed together with large springs to a pressure of about 1500 lbs. per square inch. Under this pressure, the toner exhibits plastic flow, and penetrates the paper. An advantage of this approach is zero warmup time. A disadvantage is a glossy appearance to the finished copies.

This method is well suited for fusing soft metal powders into foil. Under sufficient pressure, the metal particles exhibit both liquid flow, and diffusion bonding or welding. The result is a polished homogeneous foil that cannot be distinguished from virgin foil with the naked eye.

Figure 7A:
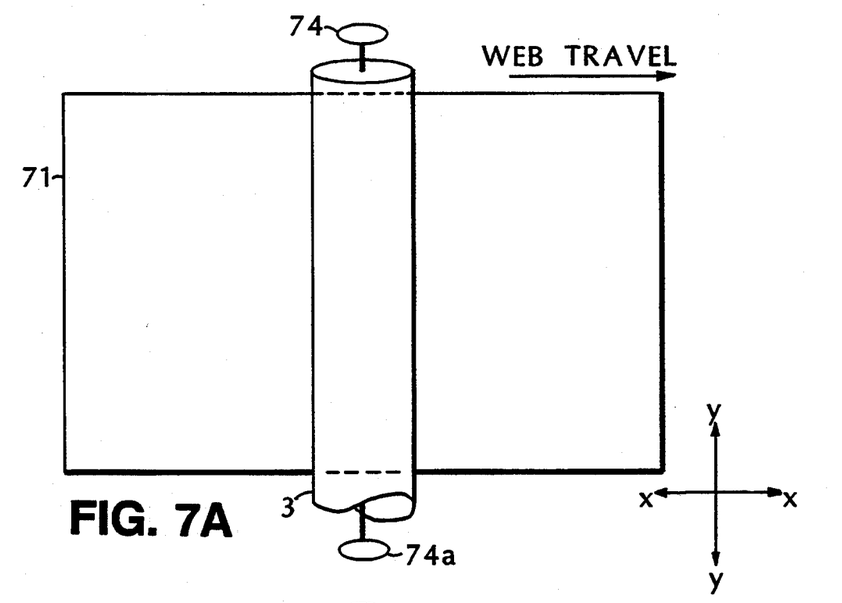
FIGS. 7A and 7B are plan and elevation views of a system using cold pressure fusing.
Figure 7B:
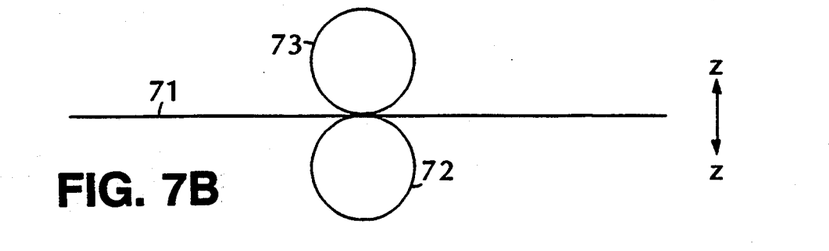

Referring to FIGS. 7A and 7B, there are shown plan and elevation views, respectively, of such a system. When a flexible substrate such as Kapton is passed between such rollers, the Z axis compression is sufficient to cause X and Y axis expansion. If the web travel is viewed as the X axis, and the roller axis is viewed as the Y axis, the web may expand in the X axis (web travel), but cannot expand in the Y axis while it is captive between the rollers. This constraint results in a tendency for the web to crease and wrinkle.

Another concern is work hardening of the metal, resulting in brittle foil.

These difficulties are addressed with the application of ultrasound. Ultrasonic welding is a well understood art, and is especially effective on soft metals. It is a cold process in which the surfaces of the parts to be welded are pressed together with moderate force between two jaws or tips. Ultrasound energy is then imposed on one of the jaws or tips such that the motion is parallel to the plane of the joint surfaces.

This invention preferably employs ultrasonic welding principles to enhance fusing. Referring again to FIG. 7, ultrasonic transducer 74, and optionally 74a, is attached to upper roller 73 or to lower roller 72. It applies ultrasonic vibration in the Y axis, causing a shearing motion between the two rollers. This greatly increases diffusion bonding between the particles, allowing reduced pressure between the rollers.

Reducing pressure between the rollers reduces the X and Y expansion of web 71. The shearing vibration permits the web to slip while captive between the rollers, reducing the difference between X and Y expansion.

Alternatively, the ultrasonic motion may be applied to one or both pressure rollers 72 and 73 in the X axis, or as a torque. Both of these embodiments use two transducers 74 and 74a, one for each end of the rollers 72 and/or 73. It is known that ultrasound has significant annealing effects as well as welding effects, and will reduce work hardening of the finished foil. It has been discovered that metal powders on paper substrate penetrate the surface of the paper when passed through a cold fuser, and bond firmly. Roughening the surface of the target substrate provides a bond of high peel strength between the foil and the substrate.

This roughening can be accomplished by chemical etch, abrasives, sandblasting, or the like. A preferred method is corona etch, well known in the plastics industry, in which the target substrate passes a very high voltage corona prior to imaging. This corona produces a large quantity of ions with sufficient velocity to thoroughly roughen the surface of the substrate. This process is a clean and efficient method of surface etching, requiring no consumables, and creating little or no waste materials.

When an etched and imaged substrate is passed through a cold pressure fuser, the toner penetrates the etch topography, providing a bond between the foil and the substrate.

In the case where additional bond strength is desired, or corona etching is undesirable, the bond between foil and substrate may be provided by a range of adhesives, such as of the hot melt family. The adhesive may be supplied as a resin powder, like toner, and imaged directly onto the target substrate, in a similar manner to metal toner imaging, with a complete and separate dedicated electrographic stage. In this case, because the adhesive resin has much the same properties as conventional plastic toners, conventional copier or printer designs may be employed, with some small changes.

This method has been successfully practiced, and provides excellent bond strength using ordinary toner. In actual practice, a nonpigmented adhesive resin with somewhat different melt and tack properties may be developed. Single or dual component epoxies may be employed if desired. In the latter case, one or both resins may be microencapsulated in thermoplastic, allowing heat activation of the epoxy.

Figure 8:
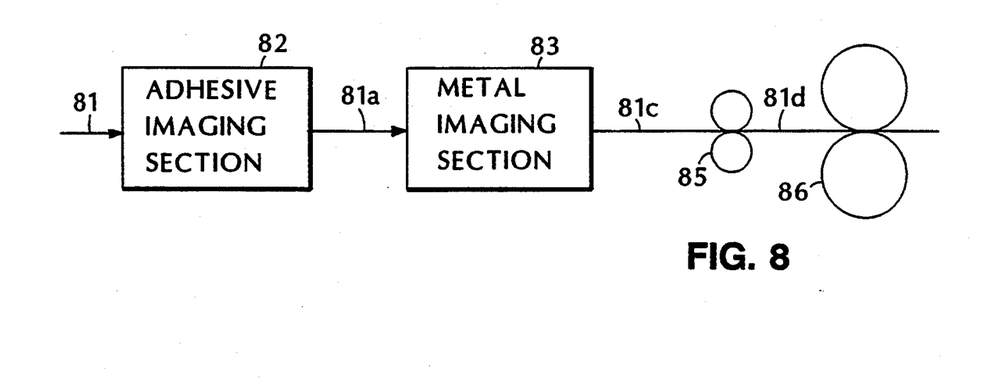
FIG. 8 is a diagrammatic representation of an adhesive bonding system according to the invention.

Referring to FIG. 8, there is shown a diagrammatic representation of this system. Adhesive imaging section 82 is made integral to the system, complete with thermal fusing. Substrate 81 passes through section 82 first, and emerges complete with imaged and fused adhesive 81a. It then passes to the metal imaging section 83, where the metal image is placed in precise registration on top of the adhesive image 81c. A second thermal fuser 85 is placed after metal imaging section 83, remelting the adhesive, which adheres to copper powder 81d. Substrate 81 then passes to cold fuser 86. Alternatively, cold fuser 86 may be heated sufficiently to melt the adhesive, or the thermal fuser may be located after the cold fuser.

To minimize disturbance of the metallic image, thermal fuser 85 may be of the noncontacting type, such as convection, infrared, vapor phase reflow, or the like.

An alternative to direct imaging of the substrate is to employ the commercially available Delphax transfix method modified by adding ultrasound to the pressure roller.

The metallic toners according to the invention typically range in size from 1 micron to 20 microns. Powders of this size range have a resulting bulk surface area as high as 1.2 meters/gram. Upon exposure to air, oxidation of the particles is very rapid. Bulk powders in the 10 to 20 micron range will surface oxidize within hours; smaller particles are known to oxidize in less than 1 minute, and can pose a fire hazard. For this reason, such powders are often shipped in sealed containers, packed under argon or nitrogen. The larger powders used in the dry processes, e.g. 10 micron, may develop an oxide skin around the particle. This skin may interfere with both conduction and diffusion bonding of the particles into foil. The smaller particles may oxidize completely. In a Gaussian mix of sizes, typical of a vendor supplied powder, this oxidation may contribute heavily to the total metal oxides in the bulk powder.

It has been determined with empirical testing that the surface oxidation of bulk 10 micron copper powder does not materially effect image development. It has also been determined that oxidized 10 micron powder, cold fused into foil without ultrasonic assistance, exhibits acceptable conductance. It is expected that ultrasound will enhance this conductance further.

It is believed that the mass ratio between the oxide skin and the base metal bulk of each particle is quite high. The oxide is very brittle, and is believed to pulverize under fuser pressure. The extremely small oxide fines created may be absorbed into the base metal during the plastic flow stage of fusing.

In an embodiment using inert gas feed, the metallic toner is supplied in sealed containers that are filled with an inert gas to prevent oxidation during shipping and storage. These containers may have a membrane seal over the exit opening which is automatically perforated by the machine when the container is inserted.

The development area of the machine, comprising the toner supply container, the receptor, developer section, and optionally the fuser, may be fully enclosed in a suitably airtight housing. This housing may be filled with an inert gas, and may contain entry and exit slots for the substrate. These slots may employ flexible lip seals to reduce the escape of inert gas. The inert gas may be maintained at a slight positive pressure to prevent air from entering the housing. The small amount of gas lost to the atmosphere may be replaced by a cylinder of makeup gas installed in or adjacent to the machine. The leakage makeup rate may be readily kept to acceptable minimums. Inert gases suitable for this purpose include nitrogen, argon, or helium.

A modification of the preceding approach employs a similar housing, which may be open at the top if desired. A sump area, integral to or communicating with said housing, is provided and filled with a suitable fluid such as one of the Fluorinerts.

This sump is heated to sufficient temperature to vaporize some of the fluid. The vapor fills the housing, providing an inert atmosphere for the development process.

Natural condensation may occur on the walls of the housing, and the condensate will flow down to the sump where it is revaporized. A condensing device, such as a liquid cooled heat exchanger or the like, may be placed at the top of the enclosure to effect recovery of the vapor and minimize loss. If the boiling point of the selected fluid is sufficiently high, the condensing device may be cooled passively to ambient air temperature. If a lower boiling point fluid is desired, to reduce the development atmosphere temperature, a refrigerated condensing unit may be employed.

The metallic toner may be passivated with a film coating on the particles which prevents oxidation. Said prevention may be made by means of air exclusion, substitution oxidation, or both. Said coating may be in the form of a liquid in the toner packaging, or may be a dry material applied to the toner during manufacture.

The above described coating may be removed from the toner particles by the machine, in real time, just before development. This removal may be effected by forced or natural evaporation, rinsing with a suitable solvent (and drying if needed), or by suitable chemical reaction. If natural evaporation is employed, the supply container may be Chilled to control it.

The adhesive imaging technique described above is also well suited for imaging solder mask to finished circuit boards. For this application, thermoplastic materials may be used, but high melt temperatures, e.g. 500 to 600 degrees F., are preferred using a high temperature fusing stage. An alternative to thermoplastics is ultraviolet-curing materials. These materials are not suited to fusing because the adhesive is shielded from light by the foil. It is well suited however to solder mask application, which is performed on the outermost surfaces of the circuit board. In this case the solder mask material is supplied as a resin powder, imaged as discussed above, and fused with ultraviolet light instead of heat. It is well known in the art to fuse rapidly traveling webs with high power ultraviolet light sources. Epoxies may also be suitable for this purpose.

Powdered, ultraviolet cured, resins are preferably melted with moderate heat prior to UV curing. This heat may be provided by the UV source itself, but may be more efficiently provided by a separate conventional heat source, such as infrared, convection, or vapor phase techniques employing materials such as the Fluorinerts.

Current state of the art now produces circuit boards of many layers, such as 22 layers. Each layer is produced as a separate batch, and hand collated into books with epoxy separator sheets between layers. These books are then laminated in a hot press. Connections between layers are accomplished by the tedious method of drilling holes where needed, plating the inner walls of the holes with electroless copper, and electroplating the copper up to desired thickness.

Figure 9A:
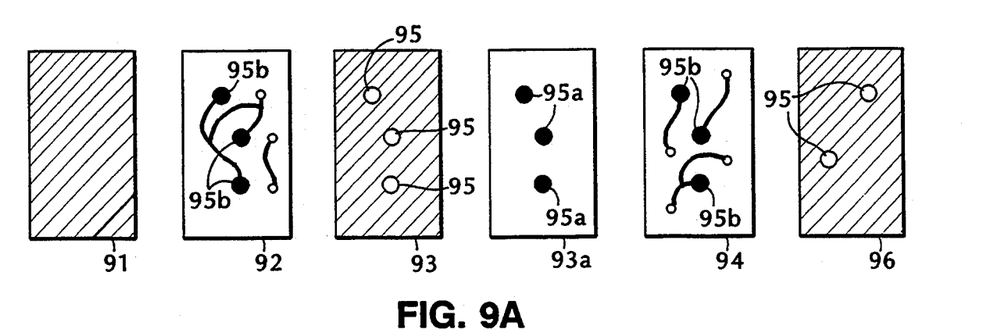
FIGS. 9 and 9B illustrate a method of fabricating multilayer circuit boards according to the invention.
Figure 9B:
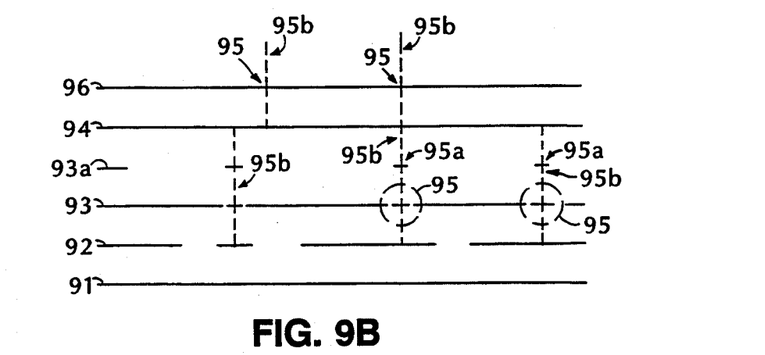

An alternative method of fabricating multilayer circuit boards is shown in FIG. 9. Base substrate 91 is imaged as described with the circuitry for the first layer 92. An insulating separator 93 is then imaged on top of circuit layer 92. This separator may be of the thermoplastic or UV curing type, or other suitable insulator. It covers circuit layer 92 in its entirety, except where a connection to the subsequent circuit layer 94 is desired.

At each desired connection, a small circle 95, of desired diameter, is deleted from the separator image, exposing the metal foil underneath. The subsequent circuit layer 94 is then imaged directly onto separator 93, and another separator 96 is imaged over circuit layer 94. The layers are preferably in direct contact with each other with no separation between them.

This effectively insulates circuit layers 92 and 94 from each other, except where the separator 93 is deleted at 95. At these locations said circuit layers 92 and 94 are electrically connected at 95b, forming a via between the two layers. This via is functionally equivalent to a plated through hole. Additional circuit layers and separators, with vias wherever desired may be applied sequentially over separator 96.

It may be advantageous to image an additional layer 93a of metallic toner over each separator, to fill the vias. This additional layer may comprise small circles of metal foil 95a, located in the holes deleted from the separator, at the desired via locations. Said circles of foil will raise the height of the circuit layer below the separator (e.g. 92) flush with the top surface of the separator (e.g. 93), to compensate for separator thickness.

Layers may be added to the substrate in batches, or circuit boards may be produced continuously with multistage machines comprising an imaging section for each layer, with said imaging stations arranged sequentially. Alternatively, a single imaging station may be arranged with transport means to image a single circuit board repeatedly, making a separate pass for each layer before releasing it, in similar fashion to a duplex (two sided) office copier. This aspect of the invention produces integrated multilayer circuit boards with plated through vias. The overall thickness of said circuit boards is much lower than conventional multilayer boards, allowing significantly more layers to be employed per unit thickness.

Metal imaging of circuit boards is not limited to copper. All metal powder will image well. This property may be used to produce circuit boards with silver or gold foil runs wherever desired. The invention may also be used to image gold fingers on edge connectors or switch contacts. With multiple passes or stages, mixed metals may be imaged on the same board if desired. The invention may also be used for nonelectronic applications, such as making decorative panels.

It if is desired to produce foil patterns of substantially higher thickness than the system will generate in a single pass, the substrate may be repeatedly passed through the unit, and reimaged a plurality of times. With each pass, an additional thickness of foil will be imaged onto the previous one. This result may be accomplished with a serially arranged multistation machine, or with a mechanical substrate handling means that returns the substrate to the imaging station for the desired number of passes before releasing it.

Other embodiments are within the claims.

What is claimed is:

1. A system for making devices having electrically conductive image paths corresponding to object paths graphically represented on a mask comprising,
    an insulative copy sheet, and
    an electrographic machine having electrically conductive toner and a bonder for bonding said electrically conductive toner to said insulative copy sheet to form said electrically conductive image paths, said insulative copy sheet configured to pass through said electrographic machine bonder and receive said electrically conductive toner only on said image paths,
    said electrically conductive toner having a conductivity sufficiently high so as to provide said electrically conductive image paths along said insulative copy sheet bearing an electrographically transferred image of said mask object paths with said electrically conductive toner bonded to said insulative copy sheet along said electrically conductive image paths with the resistance between points along said electrically conductive image paths being many times less than that of regions adjacent to said electrically conductive image paths.

2. The system of claim 1 wherein said insulative copy sheet includes a material chosen from the group consisting of mylar, polyamide, and fiberglass epoxy composites.

3. The system of claim 1 wherein said toner includes at least one material chosen from the group consisting of copper powder, ferrous oxide filings, solder powder and/or flux.

4. The system of claim 1 wherein said electrically conductive toner comprises toner particles and said bonder includes a fusing system for bonding said toner particles to each other and to said copy sheet.

5. The system of claim 4 wherein said bonder comprises a compression bonder.

6. The system of claim 4 wherein said bonder comprises an ultrasonic bonder.

7. The system of claim 1 and further comprising, a backing sheet attached to said copy sheet.

8. A method of making devices having electrically conductive paths comprising,
    forming an electromagnetic signal characterizing a graphic representation of desired electrically conductive paths,
    and electrographically transferring said electromagnetic signal to an insulative copy sheet with said electrically conductive paths established by electrically conductive toner electrographically transferred to said copy sheet of sufficiently high conductivity so that the resistance between points along said electrically conductive paths is many times lower than that of the regions adjacent to said electrically conductive paths.

9. A method of making devices having electrically conductive paths in accordance with claim 8 wherein said forming step includes computer generating said electromagnetic signal as an electrical signal identifying the location of said conductive paths on said insulative copy sheet.

10. A method of making devices having electrically conductive paths in accordance with claim 8 wherein said step of electrographically transferring includes jumping toner development.

11. A method of making devices having electrically conductive paths in accordance with claim 9 wherein said step of electrographically transferring includes jumping toner development.

12. A method of making devices having electrically conductive paths in accordance with claim 8 wherein said step of electrographically transferring includes powder cloud development.

13. A method of making devices having electrically conductive paths in accordance with claim 9 wherein said step of electrographically transferring includes powder cloud development.

14. A method of making devices having electrically conductive paths in accordance with claim 8 wherein said step of electrographically transferring includes electrophoretic development.

15. A method of making devices having electrically conductive paths in accordance with claim 9 wherein said step of electrographically transferring includes electrophoretic development.

16. A device having electrically conductive paths made in accordance with the method of claim 8.

17. A device in accordance with claim 16 wherein said device is a printed circuit board.

18. A device in accordance with claim 16 wherein said conductive paths are partially covered with solder mask material.

19. A plurality of devices in accordance with claim 16 at least first and second of said devices being printed circuit layers, at least a third of said devices being a solder mask sandwiched between and selectively separating said first and second devices to form a multilayer circuit board.

* * * * *

UNITED STATES PATENT AND TRADEMARK OFFICE
CERTIFICATE OF CORRECTION

PATENT NO.   : 5,416,569

DATED        : May 16, 1995

INVENTOR(S)  : Michael Goldberg

It is certified that error appears in the above-identified patent and that said Letters Patent is hereby corrected as shown below:

Column 3, lines 52-53, "graphically on a represented" should read --graphically represented on a--.

Column 12, line 30, "Chilled" should read --chilled--.

Signed and Sealed this

Twenty-ninth Day of October 1996

BRUCE LEHMAN

*Attest:*

*Attesting Officer*       *Commissioner of Patents and Trademarks*